United States Patent
Park et al.

(10) Patent No.: US 9,281,349 B2
(45) Date of Patent: Mar. 8, 2016

(54) ORGANIC LIGHT-EMITTING DISPLAY DEVICE

(71) Applicant: Samsung Display Co., Ltd., Yongin, Gyeonggi-Do (KR)

(72) Inventors: Kyung-Hoon Park, Yongin (KR); Sun Park, Yongin (KR); Yeong-Ho Song, Yongin (KR); Ji-Hoon Song, Yongin (KR); Yul-Kyu Lee, Yongin (KR)

(73) Assignee: Samsung Display Co., Ltd., Samsung-ro, Giheung-Gu, Yongin-si, Gyronggi-Do (KR)

( * ) Notice: Subject to any disclaimer, the term of this patent is extended or adjusted under 35 U.S.C. 154(b) by 93 days.

(21) Appl. No.: 14/090,844

(22) Filed: Nov. 26, 2013

(65) Prior Publication Data

US 2014/0353620 A1    Dec. 4, 2014

(30) Foreign Application Priority Data

May 30, 2013    (KR) .......................... 10-2013-0062113

(51) Int. Cl.
*H01L 35/24*     (2006.01)
*H01L 27/32*     (2006.01)
*H01L 51/52*     (2006.01)

(52) U.S. Cl.
CPC ........ *H01L 27/3258* (2013.01); *H01L 51/5253* (2013.01); *H01L 51/5265* (2013.01); *H01L 51/5271* (2013.01)

(58) Field of Classification Search
CPC ... H01L 23/047; H01L 3/02; H01L 23/49822; H01L 23/66; H01L 25/0655; H01L 23/49833; H01L 25/162; H01L 2223/6644; H01L 2224/48091; H01L 2224/480912; H05K 1/0243; H05K 1/141; H05K 3/4697
USPC ................... 257/728, 706, 664, 659, 204, 48; 330/133, 124, 302–306, 386, 319
See application file for complete search history.

(56) References Cited

U.S. PATENT DOCUMENTS

| | | | |
|---|---|---|---|
| 8,106,402 B2 * | 1/2012 | Yeo et al. | 257/72 |
| 2012/0074414 A1 | 3/2012 | Lee et al. | |
| 2012/0104396 A1 * | 5/2012 | Pyo | 257/59 |
| 2013/0126882 A1 * | 5/2013 | You et al. | 257/71 |

FOREIGN PATENT DOCUMENTS

| | | |
|---|---|---|
| KR | 10-2005-0112034 | 11/2005 |
| KR | 10-2007-0011008 | 1/2007 |
| KR | 10-2012-0032904 | 4/2012 |
| KR | 10-2013-0055446 | 5/2013 |

* cited by examiner

*Primary Examiner* — Dung Le
(74) *Attorney, Agent, or Firm* — Robert E. Bushnell, Esq.

(57) ABSTRACT

The organic light emitting display device includes a substrate including a thin film transistor (TFT) formed thereon, the TFT including a first insulating layer disposed between an active layer and a gate electrode, and a second insulating layer disposed between the gate electrode and source and drain electrodes; a pad electrode including a first pad layer disposed on a same layer as that where the source and drain electrodes are formed, and a second pad layer on the first pad layer; a bonding assistant layer on the substrate; a third insulating layer on the bonding assistant layer and including a first opening; a pixel electrode disposed in the first opening and electrically coupled to one of the source and drain electrodes; and a fourth insulating layer on the pixel electrode to cover a peripheral end portion of the pixel electrode and defining a pixel through a second opening.

24 Claims, 9 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 30 May 2013 and there duly assigned Serial No. 10-2013-0062113.

BACKGROUND OF THE INVENTION

1. Field of the Invention

Embodiments of the present invention relate to an organic light emitting display device, and a method of manufacturing the same.

2. Description of the Related Art

An organic light-emitting diode (OLED) display device includes a hole injection electrode, an electron injection electrode, and an emissive layer (EML) interposed therebetween. The OLED display device is a self-emissive display in which holes and electrons injected from the hole injection electrode and the electron injection electrode, respectively, recombine in the EML to emit light. In addition, since OLED display devices exhibit high quality characteristics such as low power consumption, high brightness, and a high response rate, the OLED display devices are receiving much attention as next-generation display devices.

SUMMARY OF THE INVENTION

The present invention provides an organic light emitting display device and a method of manufacturing the same.

According to an aspect of the present invention, there is provided an organic light emitting display device including: a substrate including a thin film transistor (TFT) formed thereon, wherein the TFT includes an active layer, a gate electrode, a source electrode and a drain electrode, a first insulating layer disposed between the active layer and the gate electrode, and a second insulating layer disposed between the gate electrode, and the source and drain electrodes; a pad electrode including a first pad layer, which is disposed on a same layer as that where the source electrode and the drain electrode are formed, and a second pad layer disposed on the first pad layer; a bonding assistant layer formed on the substrate; a third insulating layer formed on the bonding assistant layer and including a first opening; a pixel electrode formed in the first opening of the third insulating layer and electrically coupled to one of the source electrode and the drain electrode; a fourth insulating layer that is formed on the pixel electrode so as to cover a peripheral end portion of the pixel electrode and defines a pixel through a second opening at a location corresponding to the first opening of the third insulating layer; an emissive layer disposed on the pixel electrode; and an opposite electrode disposed on the emissive layer.

An inner end of the bonding assistant layer may extend to an etched surface of the first opening of the third insulating layer.

An inner end of the bonding assistant layer may extend beyond an etched surface of the first opening of the third insulating layer and may be exposed through the first opening.

The fourth insulating layer may cover the inner end of the bonding assistant layer exposed by the first opening.

The pixel electrode directly may contact the inner end of the bonding assistant layer.

The bonding assistant layer may enclose at least a portion of the pixel.

The third insulating layer may be an organic insulating layer.

The fourth insulating layer may be an organic insulating layer.

The third insulating layer may cover the source electrode and the drain electrode.

The bonding assistant layer may include a same material as that of the second pad layer.

The bonding assistant layer may include a transparent conducting oxide.

The bonding assistant layer may include indium tin oxide (ITO).

The first pad layer may include a same material as that of the source electrode and the drain electrode.

The pixel electrode may include a transflective metal layer.

The transflective metal layer may be made of silver (Ag) or Ag alloy.

A protective layer of a transparent conducting oxide may be stacked on the transflective metal layer.

A portion of the first insulating layer may include a hole in a region corresponding to an edge of the pixel.

The organic light emitting display device may further include a buffer layer that is formed between the substrate and the first insulating layer and may be formed of an inorganic material.

An opening formed in the second insulating layer, the first opening of the third insulating layer, and the second opening of the fourth insulating layer may overlap one another, and wherein a size of the first opening may be larger than that of the second opening and smaller than that of the opening of the second insulating layer.

The organic light emitting display device may further include a pixel electrode contact unit that electrically connects one of the source electrode and the drain electrode to the pixel electrode through a contact hole formed in the third insulating layer, and wherein the pixel electrode contact unit may have a plurality of contact points.

The pixel electrode contact unit may include a first contact layer including a same material as that of the source electrode and the drain electrode, and a second contact layer including a same material as that of the second pad layer.

The pixel electrode may electrically contact the second contact layer.

The pixel electrode contact unit may further include a third contact layer, which is disposed between the first and second insulating layers and includes a same material as that of a second electrode of a capacitor, and a fourth contact layer formed on the third contact layer.

The pixel electrode may electrically contact the third contact layer.

According to another aspect of the present invention, there is provided a method of manufacturing an organic light emitting display device. The method includes steps of a first mask process including forming a semiconductor layer on a substrate and patterning the semiconductor layer to form an active layer of a thin film transistor (TFT) and a first electrode of a capacitor; a second mask process including forming a first insulating layer, forming a transparent conducting oxide layer on the first insulating layer, and patterning the transparent conducting oxide layer to form a second electrode of the capacitor; a third mask process including forming a first metal layer and patterning the first metal layer to form a gate electrode of the TFT on a same layer as that where the second electrode is formed; a fourth mask process including forming a second insulating layer, forming a contact hole for exposing a portion of the active layer in the second insulating layer, and forming a first opening in a region separated from a side of the active layer; a fifth mask process including forming a second metal layer and patterning the second metal layer to form a source electrode, a drain electrode, and a first pad layer of a pad electrode; a sixth mask process including forming a transparent conducting oxide layer, and patterning the transparent conducting oxide layer to form a second pad layer on the first pad layer and a bonding assistant layer covering an etched surface of the first opening; a seventh mask process including forming a third insulating layer as an organic insulating layer, and forming a second opening smaller than the first opening in a region overlapping the first opening of the third insulating layer and an opening for exposing an upper surface of the second pad layer; an eighth mask process including forming a transflective metal layer, and patterning the transflective metal layer to form a pixel electrode in the second opening; a ninth mask process including forming a fourth insulating layer, and forming a third opening in the fourth insulating layer so as to expose an upper surface of the pixel electrode and to define a pixel; forming an emissive layer on the pixel electrode; and forming an opposite electrode on the emissive layer.

In the sixth mask process, the bonding assistant layer may be formed on the etched surface of the first opening so as to enclose at least a portion of the pixel.

An inner end of the bonding assistant layer may extend to an etched surface of the second opening of the third insulating layer, or project beyond an etched surface of the second opening towards the pixel.

In the ninth mask process, the third opening of the fourth insulating layer may be formed so that an etched surface of the third opening projects towards a center of the pixel more than an inner end of the bonding assistant layer.

In the patterning of the second metal layer, a first contact layer of a pixel electrode contact unit may be formed, and the transparent conducting oxide of the second pad layer may be patterned to form a second contact layer on the first contact layer.

The transparent conducting oxide of the second electrode of the capacitor may be used to form a third contact layer, and the first metal layer may be used to form a fourth contact layer on the third contact layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

As the invention allows for various changes and numerous embodiments, embodiments will be illustrated in the drawings and described in detail in the description. However, this is not intended to limit the present invention to a particular mode of practice, and it is to be appreciated that the present invention encompasses all changes, equivalents, and substitutes that do not depart from the spirit and technical scope thereof. In the description of the present invention, well-known methods will not be described in detail so as not to unnecessarily obscure the essence of the present invention. While the terms such as "first" and "second" may be used to describe various components, such components must not be limited to the above terms. The terms are used only to distinguish one component from another. The terms used in the present application are merely used to describe an embodiment, and are not intended to limit the present invention. Use of singular forms includes plural references as well unless expressly specified otherwise. The terms "comprising", "including", and "having" specify the presence of stated features, numbers, steps, operations, elements, components, and/or a combination thereof but do not preclude the presence or addition of one or more other features, numbers, steps, operations, elements, components, and/or a combination thereof. As used herein, the term "and/or" includes any and all combinations of one or more of the associated listed items. Expressions such as "at least one of," when preceding a list of elements, modify the entire list of elements and do not modify the individual elements of the list.

In the drawings, the dimensions of layers and regions may be exaggerated for clarity. Like reference numerals refer to the like elements throughout. It will also be understood that when a layer, film, region, or substrate is referred to as being "on" another layer, film, region, or substrate, it can be directly on the other layer, film, region, or substrate, or intervening layers may also be present.

Figure 1:
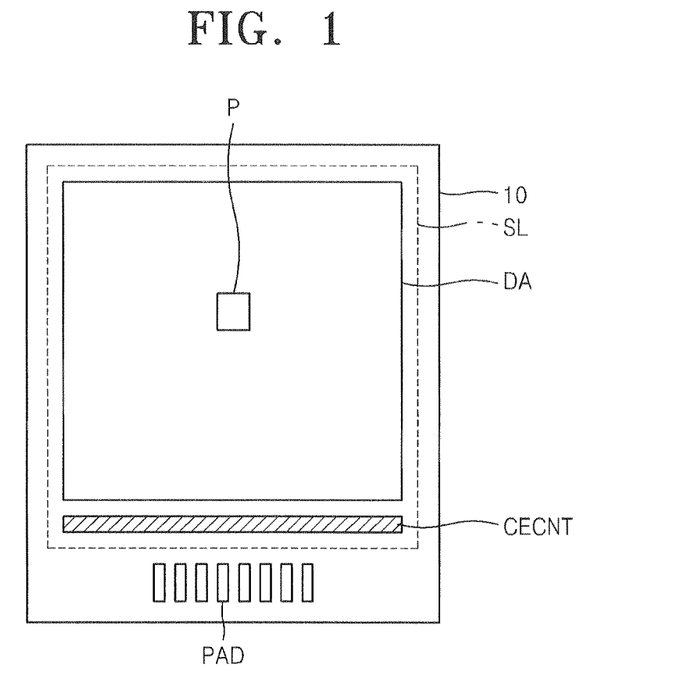
FIG. 1 illustrates a schematic plan view of an organic light emitting display device according to an embodiment of the present invention.
Figure 2:
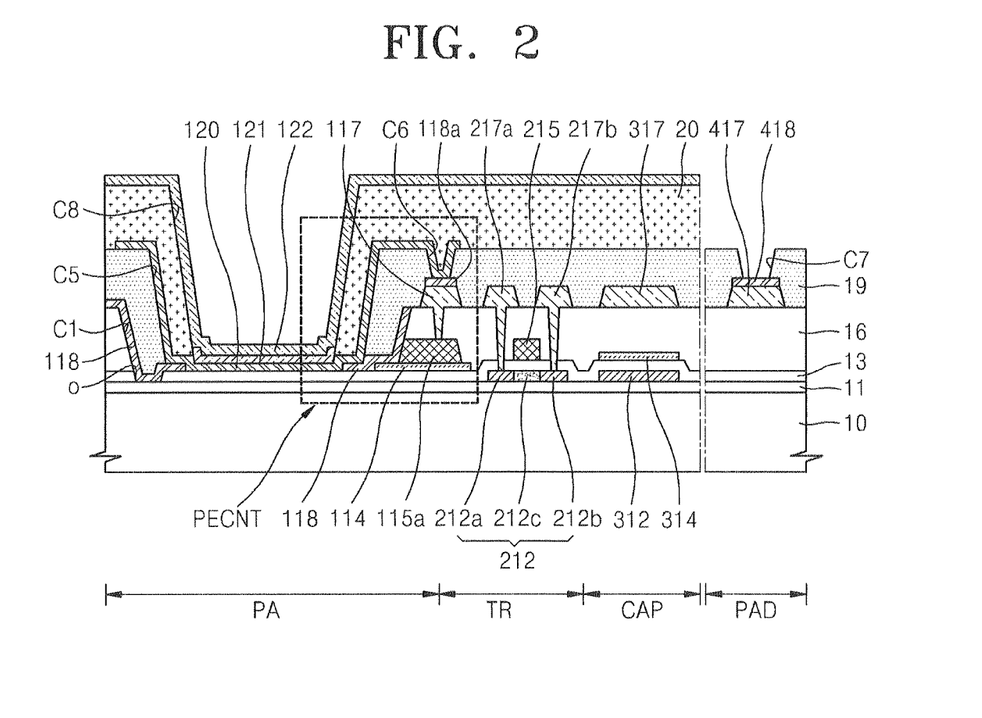
FIG. 2 is a schematic cross-sectional view of an organic light emitting display device according to an exemplary embodiment of the present invention.
Figure 3:
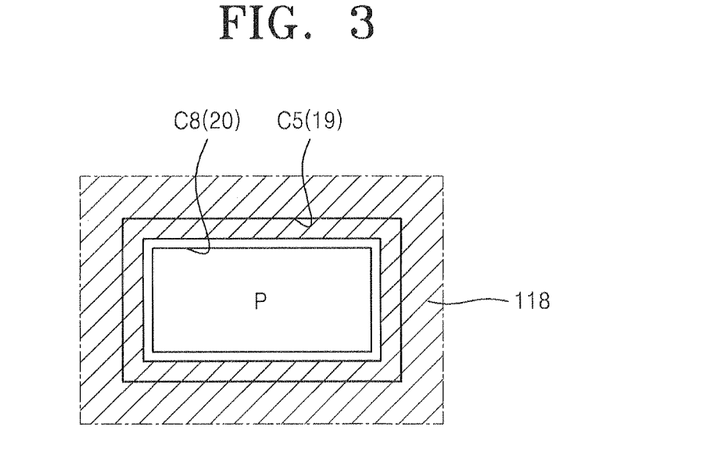
FIG. 3 is a plan view of a pixel area shown in FIG. 2.

FIG. 1 illustrates a schematic plan view of an organic light emitting display device according to an embodiment of the present invention. FIG. 2 is a schematic cross-sectional view of an organic light emitting display device according to an exemplary embodiment of the present invention. FIG. 3 is a plan view of a pixel area shown in FIG. 2.

In reference to FIG. 1, in the organic light emitting display device according to the present embodiment, a substrate 10 includes a display area DA in which a plurality of pixels P are formed to display an image. A sealant line SL is disposed outside the display area DA so as to seal a sealing member (not shown) for enclosing the display area DA, and a cathode contact unit CECNT disposed between the display area DA and a pad area PAD to supply power to an opposite electrode (122 in FIG. 2) commonly formed in the display area DA.

In reference to FIG. 2, the substrate 10 includes a transistor region TR having at least one thin film transistor (TFT), a pixel area PA having at least one emissive layer (EML) 121, a capacitor region CAP having at least one capacitor, and the pad area PAD.

The transistor region TR includes the substrate 10, a buffer layer 11, and a TFT formed of an active layer 212, a gate electrode 215, a source electrode 217a and a drain electrode 217b.

The substrate 10 may be a transparent glass substrate. Alternatively, the substrate 10 may be a plastic substrate made of polyethylen terephthalate (PET), polyethylen naphthalate (PEN), or polyimide, etc.

A buffer layer 11 is disposed on the substrate 11 so as to planarize an upper surface and prevent impure elements from penetrating into the substrate 10. The buffer layer 11 may be formed from a single layer or a plurality of layers of an inorganic material such as silicon nitride and/or silicon oxide.

While FIG. 2 shows that a hole o is formed in a portion of a first insulating layer 13, the present invention is not limited thereto. For example, a portion of the first insulating layer 13 may include the hole o at a location corresponding to an edge of the pixel P. The hole may be formed when a portion of the first insulating layer 13 is overetched due to an alignment error between a gate metal layer (115 in FIG. 4D) and an opening C1 during formation of a fourth contact layer 115a as will be described below. A portion of the buffer layer 11 may be exposed through the hole o of the first insulating layer 13. In another embodiment, in the absence of such an alignment error between the gate metal layer 115 and the opening C1 during formation of the fourth contact layer 115a, there is no danger of overetching a portion of the first insulating layer 13, so the hole o may not be formed.

The active layer 212 may be formed of a semiconductor including amorphous or crystalline silicon, but is not limited thereto. For example, the active layer 212 may include an oxide semiconductor. The active layer 212 includes a channel region 212c and source and drain regions 212a and 212b respectively disposed at either side of the channel region 212c. The source and drain regions 212a and 212b are doped with ion impurities.

A gate electrode 215 is formed on a portion of the first insulating layer 13, which is a gate insulating layer, at a location corresponding to the channel region 212c of the active layer 212. The first insulating layer 13 may be formed of an inorganic material such as silicon dioxide ($SiO_2$), silicon nitride ($SiN_x$), silicon oxynitride (SiON), aluminium oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), or lead zirconium titanate (PZT).

The gate electrode 215 may be formed from a single layer or a plurality of layers including at least one metal selected from the group consisting of aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The source electrode 217a and the drain electrode 217b are disposed on the gate electrode 215 by interposing a second insulating layer 16 as an interlayer insulating layer therebetween and are respectively electrically connected to the source region 212a and the drain region 212b.

The second insulating layer 16 may be formed of an inorganic material such as $SiO_2$, $SiN_x$, SiON, $Al_2O_3$, $TiO_2$, $Ta_2O_5$, $HfO_2$, $ZrO_2$, BST, or PZT.

The source electrode 217a and the drain electrode 217b may be formed from two or more layers of two different metals with different electron mobilities. For example, the two different metals may be selected from the group consisting of Al, Pt, Pd, Ag, Mg, Au, Ni, Nd, Ir, Cr, Li, Ca, Mo, Ti, W, Cu, or an alloy thereof.

A third insulating layer 19 is disposed on the second insulating layer 16 to cover the source electrode 217a and the drain electrode 217b.

The first and second insulating layers 13 and 16 may be each formed from a single layer or a plurality of layers of an inorganic insulation material while the third insulating layer 16 may be formed of an organic insulation material. The third insulating layer 19 may include general-purpose polymers such as polymethylmethacrylate (PMMA) or polystyrene (PS), polymer derivatives including a phenol group, acrylic polymers, imide based polymers, arylether based polymers, amide based polymers, fluorine based polymers, p-xylene based polymers, vinyl alcohol based polymers, or blends thereof.

A fourth insulating layer 20 is formed on the third insulating layer 19. The fourth insulating layer 20 may be formed of an organic insulation material. The fourth insulating layer 20 may include general-purpose polymers such as PMMA or PS, polymer derivatives including a phenol group, acrylic polymers, imide based polymers, arylether based polymers, amide based polymers, fluorine based polymers, p-xylene based polymers, vinyl alcohol based polymers, or blends thereof.

The pixel area PA includes the substrate, the buffer layer 11, the first insulating layer 13, a bonding assistant layer 118, the third insulating layer 19, a pixel electrode 120 on the third insulating layer 19, and the fourth insulating layer 20.

The bonding assistant layer 118 is a bonding medium for enhancing a bond strength between the third and first insulating layers 19 and 13. As described above, in the presence of the hole o in the first insulating layer 13, the bonding assistant layer 118 may be used to improve bond strengths between the third and first insulating layers 19 and 13 as well as between the third insulating layer 19 and the buffer layer 11 exposed through the hole o in the first insulating layer 13.

The opening C1, an opening C5, and an opening C8 are respectively formed in the second insulating layer 16, the third insulating layer 19, and the fourth insulating layer 20 in an overlapping manner. The opening C5 in the third insulating layer 19 is larger than the opening C8 in the fourth insulating layer 20, and is smaller than the opening C1 in the second insulating layer 16.

Since the opening C5 in the third insulating layer 19 is smaller than the opening C1 in the second insulating layer 16, in the absence of the bonding assistant layer 118, the third insulating layer 19 that is an organic layer contacts the buffer layer 11 and/or the first insulating layer 13 that are inorganic layers. While an organic layer exhibits excellent adhesion properties with a metal, the organic layer has weak adhesion properties with an inorganic layer. When adhesion between the third insulating layer 19 and the buffer layer 11 and/or the first insulating layer 13 is weak, the third insulating layer 19 may detach from the buffer layer 11 and/or the first insulating layer 13, or air bubbles may occur therebetween. Furthermore, a short defect may occur between the pixel electrode 120 and the opposite electrode 122 due to foreign materials such as organic particles included in the third insulating layer 19 or metallic particles (e.g., Ag particles) included in the pixel electrode 120.

However, according to the present embodiment, the bonding assistant layer 118 acting as a bonding medium is formed below the third insulating layer 19, thereby eliminating the possibility that the third insulating layer 19 may detach and/or air bubbles may occur. Thus, a short defect between the pixel electrode 120 and the opposite electrode 122 may be prevented. The bonding assistant layer 118 may be made of a transparent conducting oxide (TCO) such as indium tin oxide (ITO) that provides reliable endurance.

In reference to FIGS. 2 and 3, the bonding assistant layer 118 is formed on the second insulating layer 16 and below the third insulating layer 19. The bonding assistant layer 118 may be formed so as to surround at least a portion of the pixel P. According to the present embodiment, the bonding assistant layer 118 may be doughnut-shaped so as to enclose the entire pixel P. The bonding assistant layer 118 may also be formed along a peripheral of the opening C1 formed in the second insulating layer 16 so as to surround the pixel P.

An inner end of the bonding assistant layer 118 may extend directly below an etched surface of the opening C5 in the third insulating layer 19. Alternatively, the inner end of the bonding assistant layer 118 may project and extend far beyond the etched surface towards a center of the pixel P in consideration of a process error or margin. In this case, a portion of the bonding assistant layer 118 may be exposed through the opening C5 of the third insulating layer 19.

The pixel electrode 120 may be disposed in the opening C5 of the third insulating layer 19. A peripheral end portion of the pixel electrode 120 is disposed in a top end of the opening C5 and covered by the fourth insulating layer 20.

An upper surface of the pixel electrode 120 disposed in the opening C5 of the third insulating layer 19 is exposed through the opening C8 of the fourth insulating layer 20, and is electrically connected to one of the source and drain electrodes 217a and 217b of a driving transistor through a pixel electrode contact unit PECNT.

The pixel electrode contact unit PECNT may include a first contact layer 117 including a same material as those of the source and drain electrodes 217a and 217b and a second contact layer 118a including a same material as that of a second pad layer 418 and the bonding assistant layer 118. Although not shown in detail in FIG. 2, the first contact layer 117 may be connected to a data line (not shown) that may be electrically connected to one of the source and drain electrodes 217a and 217b of the driving transistor.

The pixel electrode contact unit PECNT includes a third contact layer 114 including a TCO and a fourth contact layer 115a including a same material as that of the gate electrode 215. The pixel electrode contact unit PECNT may have a double-contact structure including a first contact point having first and second contact layers 117 and 118a and a second contact point having third and fourth contact layers 114 and 115a. In the presence of a defect in one contact point, the double-contact structure may still allow normal reception of a signal from a driver due to the contact at the other contact point.

The pixel electrode 120 may include a transflective metal layer (120b in FIG. 4). The pixel electrode 120 includes a transflective metal layer 120b. The pixel electrode 120 may further include layers 120a and 120c that are respectively formed in lower and upper portions of the transflective metal layer 120b and include the transparent conductive oxide protecting the transflective metal layer 120b. The transflective metal layer 120b may be formed of Ag or an Ag alloy. The layers 120a and 120c may include at least one material selected from the group consisting of ITO, indium zinc oxide (IZO), zinc oxide (ZnO), indium oxide ($In_2O_3$), indium gallium oxide (IGO), and aluminum zinc oxide (AZO). The transflective metal layer 120b forms a micro-cavity structure along with the opposite electrode that is a reflective electrode as will be described below, thereby enhancing the optical efficiency of the organic light emitting display device.

If electrons are supplied to metal having a strong reduction like silver (Ag) forming the transflective metal layer 120b during an etching process for patterning the pixel electrode 120, silver (Ag) ions present in an etchant in an ion state may be problematically educed as silver (Ag) again. Such educed silver (Ag) may be a particle related defect factor causing a dark spot during a subsequent process of forming the pixel electrode 120. When the source and drain electrodes 217a and 217b, a first pad layer 417, and data lines (not shown) made of the same material as those of the source and drain electrodes 217a and 217b and the first pad layer 417 are exposed to an etchant during etching of the pixel electrode 120 including Ag, silver (Ag) ions having a strong reduction may be educed as silver (Ag) again by receiving electrons from these metal materials. For example, if the above-described metal materials include Mo or Al, silver (Ag) may be educed again by providing electrons received from molybdenum or aluminum to silver (Ag) ions again.

However, in the organic light emitting display device according to the present embodiment, since the source or drain electrode 217a or 217b remains covered by the third insulating layer 19 that is an organic layer, the source or drain electrode 217a or 217b is not exposed to an etchant including Ag ions during etching of the pixel electrode 120 including Ag. Thus, it is possible to prevent the occurrence of particle defects due to eduction of Ag. Furthermore, since the first contact layer 117 of the pixel electrode contact unit PECNT and the first pad layer 417 are located on regions exposed to contact holes C6 and C7 formed in the third insulating layer 19, respectively, protective layers, i.e., the second contact layer 118a and the second pad layer 418 are formed on the first contact layer 117 and the first pad layer 417, respectively, so as not to expose the first contact layer 117 and the first pad layer 417 to an etchant during etching of the pixel electrode 120. Thus, it is possible to prevent occurrence of particle defects due to Ag eduction.

The fourth insulating layer 20 that covers the peripheral end portion of the pixel electrode 120 may cover a portion of the bonding assistant layer 118 exposed through the opening C5 of the third insulating layer 19. For example, as shown in FIGS. 2 and 3, an inner end of the fourth insulating layer 20 may project and extend towards the center of the pixel P more than the inner end of the bonding assistant layer 118. In other words, an etched surface of the opening C8 in the fourth insulating layer 20 may project and extend towards the center of the pixel P more than the inner end of the bonding assistant layer 118.

If the inner end of the bonding assistant layer 118 projects towards the center of the pixel P more than the etched surface of the opening C8 of the fourth insulating layer 20, the bonding assistant layer 118 acts as an obstacle to formation of a micro-cavity structure with the pixel electrode 120 and the opposite electrode 122, thereby degrading optical efficiency of the organic light emitting display device.

An intermediate layer including an emissive layer 121 is disposed on the pixel electrode 120 whose upper surface has been exposed through the opening C8 in the fourth insulating layer 20. The emissive layer 121 may be formed of low- or high-molecular weight organic materials. When the intermediate layer is formed of low-molecular weight organic materials, the intermediate layer is formed by stacking a hole transport layer (HTL) and a hole injection layer (HIL) on a surface of the emissive layer 121 and an electron transport layer (ETL) and an electron injection layer (EIL) on a surface of the emissive layer 121 so that the HTL and the HIL face the ETL and EIL. Various other layers may be stacked if necessary. On the other hand, when the intermediate layer is formed of high-molecular weight organic materials, the intermediate layer may include only the HTL in addition to the emissive layer 121.

The opposite electrode 122 is disposed on the emissive layer 121 so as to serve as a common electrode. In the organic light emitting display device according to the present embodiment, the pixel electrode 120 functions as an anode while the opposite electrode 122 functions as a cathode. In another embodiment, the opposite electrode 122 may be used as an anode, and the pixel electrode 120 may be used as a cathode.

The opposite electrode 122 may be a reflective electrode including a reflective material. In this case, the opposite electrode 122 may include at least one material selected from the group consisting of Al, Mg, Li, Ca, lithium fluoride/calcium (LiF/Ca), and LiF/Al. Thus, light emitted from the emissive layer 121 is reflected by the opposite electrode 122 and then passes through the pixel electrode 120 made of the transflective material into the substrate 10.

The capacitor region CAP is disposed on the substrate 10 and the buffer layer 11 and includes a capacitor including a first electrode 312 disposed on a same layer as that where the active layer 212 is formed, a second electrode 314 on a same layer as that where the gate electrode 215 is formed, and a third electrode 317 on a same layer as that where the source and drain electrodes 217a and 217b are formed.

The first electrode 312 of the capacitor may be formed of a semiconductor doped with ion impurities like the source and drain regions 212a and 212b of the active layer 212.

The second electrode 314 of the capacitor is formed on the first insulating layer 13 where the gate electrode 215 is disposed, but of a different material than the gate electrode 215. The second electrode 314 may include a TCO. By forming a semiconductor doped with ion impurities in the first electrode 312 through the second electrode 314, the capacitor may have a metal-insulator-metal (MIM) structure.

The third electrode 317 of the capacitor may be formed of a same material as that of the source and drain electrodes 217a and 217b. As described above, since the third electrode 317 is covered by the third insulating layer 19 that is an organic layer, the third electrode 317 is not exposed to an etchant including Ag ions during etching of the pixel electrode 120 including Ag, thereby preventing particle defects due to eduction of Ag. Furthermore, the capacitors may be connected in parallel in order to increase capacitance of the organic light emitting display device.

The pad area PAD includes a pad electrode that serves as a terminal connected to an external driver. The pad electrode includes the first and second pad layers 417 and 418.

The first pad layer 417 may include a plurality of metal layers with different electron mobilities. For example, the first pad layer 417 may be formed from multiple layers of at least one metal selected from the group consisting of Al, Pt, Pd, Ag, Mg, Au, Ni, Nd, Ir, Cr, Li, Ca, Mo, Ti, W, and Cu.

The second pad layer 418 may include a same material as that of the bonding assistant layer 118. For example, the second pad layer 418 may be formed of a TCO including at least one material selected from the group consisting of ITO, IZO, ZnO, $In_2O_3$, IGO, and AZO. The second pad layer 418 may prevent exposure of the first pad layer 417 to moisture and oxygen, thereby preventing degradation in reliability of a pad.

The second pad layer 418 and the second pad layer 418 include the same material and are formed by the same process, thereby eliminating the need to add a separate mask.

A method of manufacturing an organic light emitting display device according to an exemplary embodiment of the present invention will now be described with reference to FIGS. 4A through 4I.

Figure 4A:
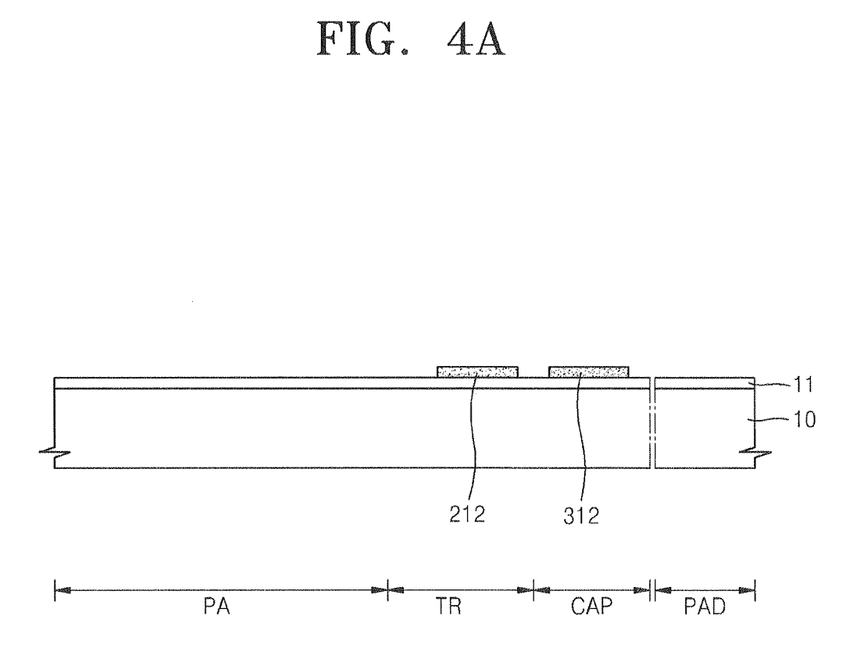
FIGS. 4A through 4I are cross-sectional views schematically illustrating a method of manufacturing an organic light emitting display device, according to an exemplary embodiment of the present invention.

FIG. 4A is a cross-sectional view schematically illustrating a first mask process in the organic light emitting display device, according to the present embodiment.

In reference to FIG. 4A, a buffer layer 11 is formed on a substrate 10, and a semiconductor layer (not shown) is formed on the buffer layer 11 and patterned to form an active layer 212 of a TFT and a first electrode 312 of a capacitor.

The buffer layer 11 may be formed from a single layer or a plurality of layers of an inorganic material such as silicon nitride and/or silicon oxide.

Figure 4B:
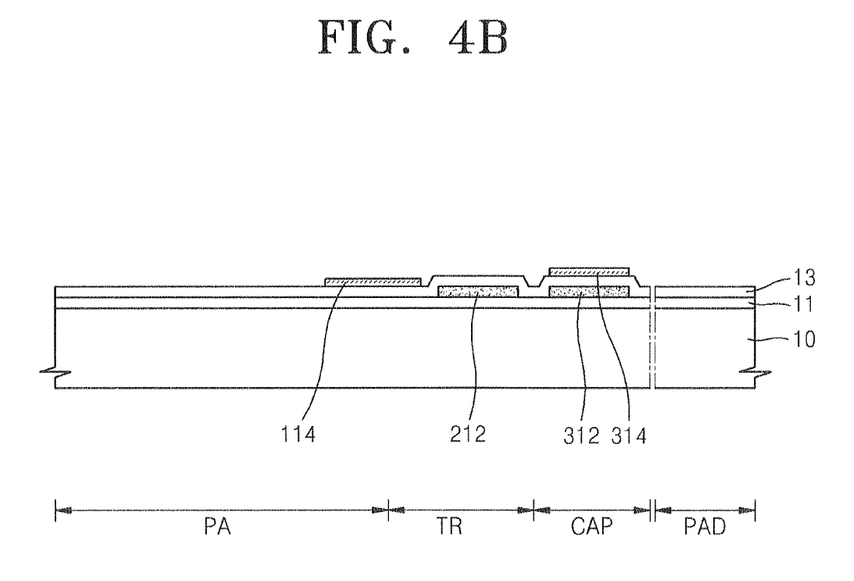

FIG. 4B is a cross-sectional view schematically illustrating a second mask process in the organic light emitting display device, according to the present embodiment.

In reference to FIG. 4B, a first insulating layer 13 is formed on the resultant structure of FIG. 4A, and a TCO layer (not shown) is formed on the first insulating layer 13 and patterned to form a second electrode 314 of a capacitor and a third contact layer 114 on the first insulating layer 13. The first insulating layer 13 may be formed of an inorganic material such as $SiO_2$, $SiN_x$, SiON, $Al_2O_3$, $TiO_2$, $Ta_2O_5$, $HfO_2$, $ZrO_2$, BST, or PZT.

Figure 4C:
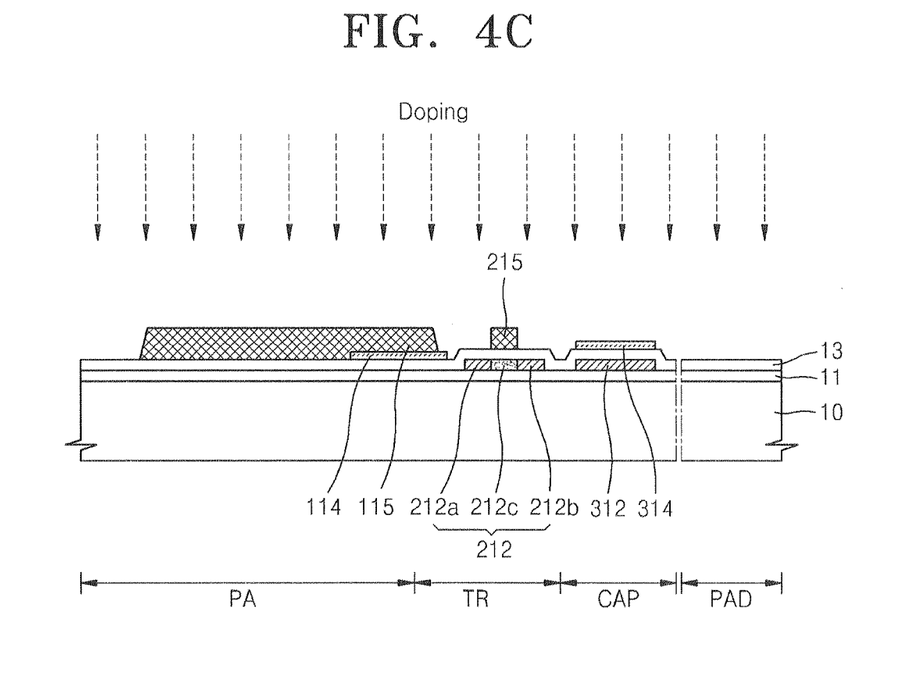

FIG. 4C is a cross-sectional view schematically illustrating a third mask process in the organic light emitting display device, according to the present embodiment.

In reference to FIG. 4C, a first metal layer (not shown) is sequentially stacked on the resultant structure of FIG. 4B and patterned to form a gate electrode 215 and a gate metal layer 115 covering the third contact layer 114 on the first insulating layer 13. In this case, the first metal layer may be formed from a single layer or multiple layers of at least one metal selected from the group consisting of Al, Pt, Pd, Ag, Mg, Au, Ni, Nd, Ir, Cr, Li, Ca, Mo, Ti, W, and Cu.

Ion impurities such as boron (B) or phosphorous (P) ions may be doped on the resultant structure at a doping concentration greater than $1 \times 10^{15}$ atoms/cm$^3$ by using the active layer 212 of the TFT as a target. By using the gate electrode 215 as a self-align mask, ion impurities are doped in the active layer 212 to form source and drain regions 212a and 212b doped with ion impurities and a channel region 212c between the source and drain regions 212a and 212b.

In this case, the first electrode 312 is also doped with the ion impurities. The active layer 212 and the first electrode 312 of the capacitor may be simultaneously doped by using a one-step doping process to thereby reduce the number of steps of the doping process.

Figure 4D:
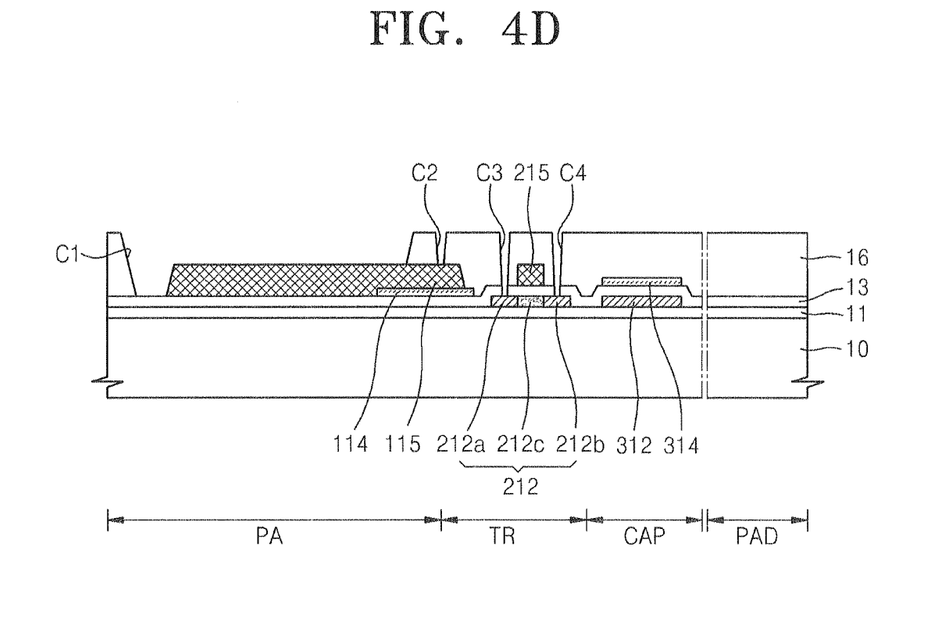

FIG. 4D is a cross-sectional view schematically illustrating a fourth mask process in the organic light emitting display device, according to the present embodiment.

In reference to FIG. 4D, a second insulating layer 16 is formed and patterned to form an opening C2 exposing the gate metal layer 115, and openings C3 and C4 exposing the source and drain regions 212a and 212b of the active layer 212, respectively, and an opening C1 is formed in a region that is separated from a side of the active layer 212 and on which a pixel electrode (120 in 4H). The second insulating layer 16 may be formed of an inorganic material such as $SiO_2$, $SiN_x$, SiON, $Al_2O_3$, $TiO_2$, $Ta_2O_5$, $HfO_2$, $ZrO_2$, BST, or PZT.

Figure 4E:
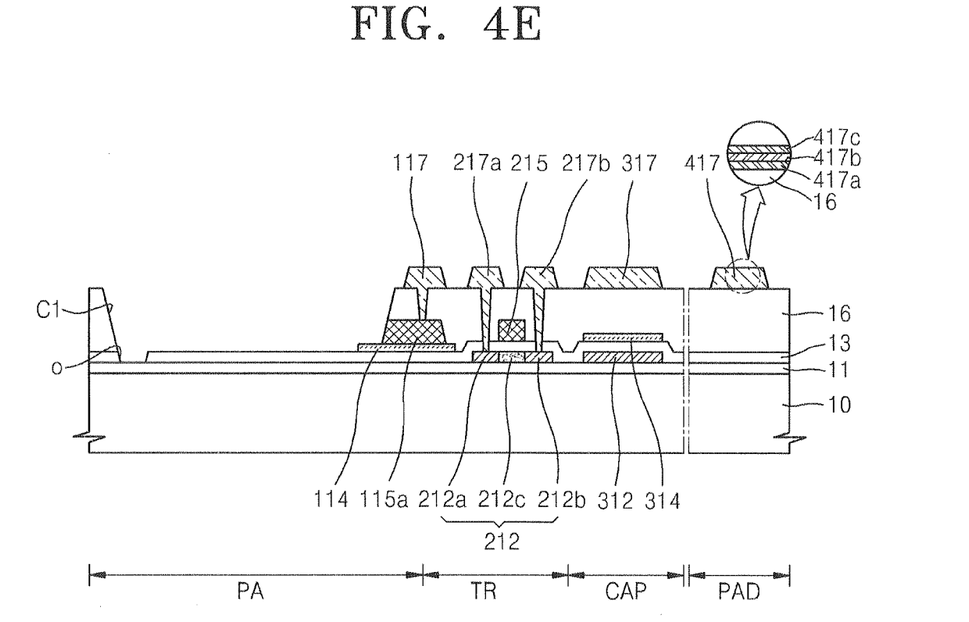

FIG. 4E is a cross-sectional view schematically illustrating a fifth mask process in the organic light emitting display device, according to the present embodiment.

In reference to FIG. 4E, a second metal layer (not shown) is formed and patterned to simultaneously form source and drain electrodes 217a and 217b, a first contact layer 117, and a first pad layer 417.

In this case, the gate metal layer 115 exposed through the opening C1 is patterned together with the second metal layer. When an alignment error occurs between one end of the gate metal layer 115 and the opening C1, a portion of the first insulating layer 13 are patterned together with the gate metal layer 115 to thereby form a hole o in the first insulating layer 13, through which the buffer layer 11 is exposed. On the other hand, in the absence of such an alignment error between the gate metal layer 115 and the opening C1, there is no danger of overetching the portion of the first insulating layer 13, so the hole o may not be formed.

The second metal layer may be formed from two or more layers of two different metals with different electron mobilities. For example, the two different metals may be selected from the group consisting of Al, Pt, Pd, Ag, Mg, Au, Ni, Nd, Ir, Cr, Li, Ca, Mo, Ti, W, Cu, or an alloy thereof.

To exemplify a configuration of the second metal layer, the structure of the first pad layer 417 is shown in detail. For example, in the present embodiment, the second metal layer may include a first layer 417a including Mo, a second layer 417b including Al, and a third layer 417c including Mo. The second layer 417b has a small resistance and excellent electrical properties, and the underlying first layer 417a acts to increase a bond or adhesion strength with the second insulating layer 16. The overlying third layer 417c may function as a barrier layer to prevent heel lock of Al included in the second layer 417b, oxidation, and diffusion.

Figure 4F:
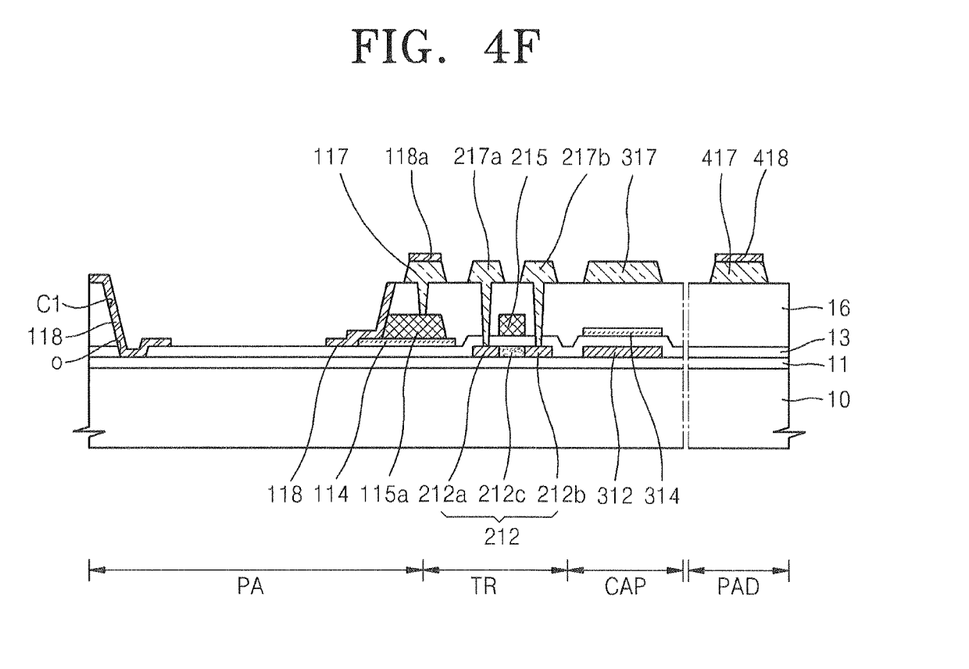

FIG. 4F is a cross-sectional view schematically illustrating a sixth mask process in the organic light emitting display device, according to the present embodiment.

In reference to FIG. 4F, a TCO layer (not shown) is formed and patterned to form a bonding assistant layer 118, a second contact layer 118a, and a second pad layer 418. The bonding assistant layer 118 may be formed along a peripheral of an etched surface of the opening C1 so as to surround a pixel defined by an opening C8 for a ninth mask process as will be described below.

As described above, the bonding assistant layer 118 and the second pad layer 418 of a pad electrode are formed by using the same mask process, thereby reducing the number of mask processes and accordingly, reducing overall manufacturing costs.

The TCO layer include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Figure 4G:
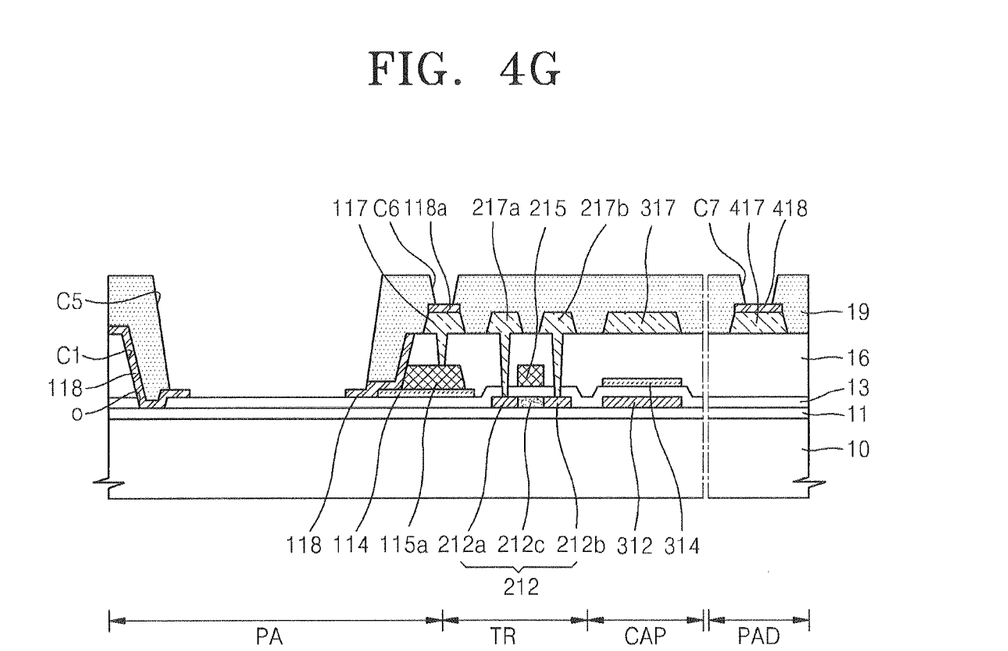
Figure 4H:
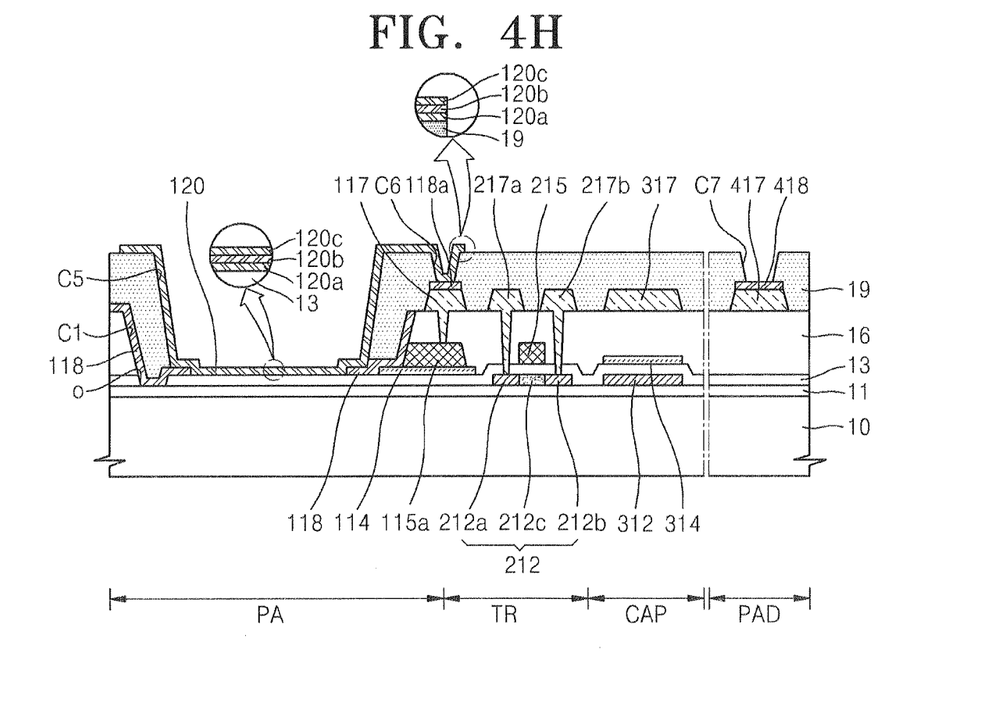

FIG. 4G is a cross-sectional view schematically illustrating a seventh mask process in the organic light emitting display device, according to the present embodiment.

In reference to FIG. 4G, a third insulating layer 19 is formed and patterned to form an opening C6 that exposes a top portion of the second contact layer 118a and an opening C7 that exposes a top portion of the second pad layer 418. An opening C5 is also formed in a pixel area PA on which the pixel electrode 120 as described below will be disposed. The opening C5 formed in the third insulating layer 19 overlaps the opening C1 formed in the second insulating layer 16 so that the opening C5 is smaller than the opening C1.

In this case, an inner end of the bonding assistant layer 118 may extend directly below an etched surface of the opening C5 in the third insulating layer 19, or project and extend far beyond the etched surface towards a center of the pixel P in consideration of a process error or margin.

In one embodiment, the opening C5 of the third insulating layer 19 may be formed so that the inner end of the bonding assistant layer 118 may extend to directly below the etched surface of the opening C5 in the third insulating layer 19. In another embodiment, the opening C5 may be patterned such that the inner end of the bonding assistant layer 118 may project and extend far beyond the etched surface towards a center of the pixel P in consideration of a process error or margin. In this case, a portion of the bonding assistant layer 118 may be exposed through the opening C5 of the third insulating layer 19.

Due to the presence of the bonding assistant layer 118, the third insulating layer 19 that is an organic layer may exhibit improved adhesion characteristics with respect to inorganic layers, i.e., the buffer layer 11 and/or the first insulating layer 13. The third insulating layer 19 may be formed of general-purpose polymers such as PMMA or PS, polymer derivatives including a phenol group, acrylic polymers, imide based polymers, arylether based polymers, amide based polymers, fluorine based polymers, p-xylene based polymers, vinyl alcohol based polymers, or blends thereof.

As described above, the third insulating layer 19 completely encloses the source and drain electrodes 217a and 217b so as to prevent heterogeneous wirings having different electric potentials from contacting an etchant including Ag ions during etching of the pixel electrode 120 including Ag. The third insulating layer 19 may function as a planarization layer.

FIG. 4H is a cross-sectional view schematically illustrating an eighth mask process in the organic light emitting display device, according to the present embodiment.

In reference to FIG. 4H, a transflective metal layer (not shown) is formed and patterned to form the pixel electrode 120. The pixel electrode 120 is connected to a driving transistor through the pixel electrode contact unit PECNT (See FIG. 2) and disposed in the opening C5 of the third insulating layer 19.

In the present embodiment, the pixel electrode contact unit PECNT includes the first contact layer 117 including the same material as that of the source and drain electrodes 217a and 217b, the second contact layer 118a including a TCO, a third contact layer 114 including TCO, and a fourth contact layer 115a including the same material as the gate electrode 215.

The pixel electrode 120 may be connected directly to the second contact layer (first contact point) through the opening C6, and to the third contact layer 114 (second contact point). In case of a contact at the second contact point, the pixel electrode 120 may be connected to the third contact layer 114 through the bonding assistant layer 118 that is formed on the third contact layer 114 and is formed of a TCO.

According to the present embodiment, the pixel electrode contact unit PECNT is configured to include two contact points, thereby preventing an increase in resistance. Furthermore, in the presence of a defect in one contact point, this structure allows normal reception of a signal from a driver due to the contact at the other contact point.

A transflective metal layer 120b of the pixel electrode 120 may be formed of Ag or an Ag alloy. The pixel electrode further includes layers 120a and 120c including the transparent conductive oxide are respectively disposed on and below the transflective metal layer 120b, to protect the transflective metal layer 120b. The layers 120a and 120c may include at least one material selected from the group consisting of ITO, IZO, ZnO, $In_2O_3$, IGO, and AZO.

According to the present embodiment, since the source or drain electrode 217a or 217b is patterned before the eighth mask process for patterning the pixel electrode 120 and remains covered by the third insulating layer 19 that is an organic layer, the source or drain electrode 217*a* or 217*b* is not exposed to an etchant including Ag ions during etching of the pixel electrode 120 including Ag.

Although the first contact layer 117 and the first pad layer 417 according to the present embodiment are respectively disposed in areas exposed by the contact holes C6 and C7 formed in the third insulating layer 19, since protective layers, i.e., the second contact layer 118 and the second pad layer 418 that are protection layers are respectively formed on the first contact layer 117 and the first pad layer 417, the first contact layer 117 and the first pad layer 417 are not exposed to the etchant during the process of etching the pixel electrode (120), thereby preventing a particle related defect due to the eduction of silver (Ag).

Figure 4I:
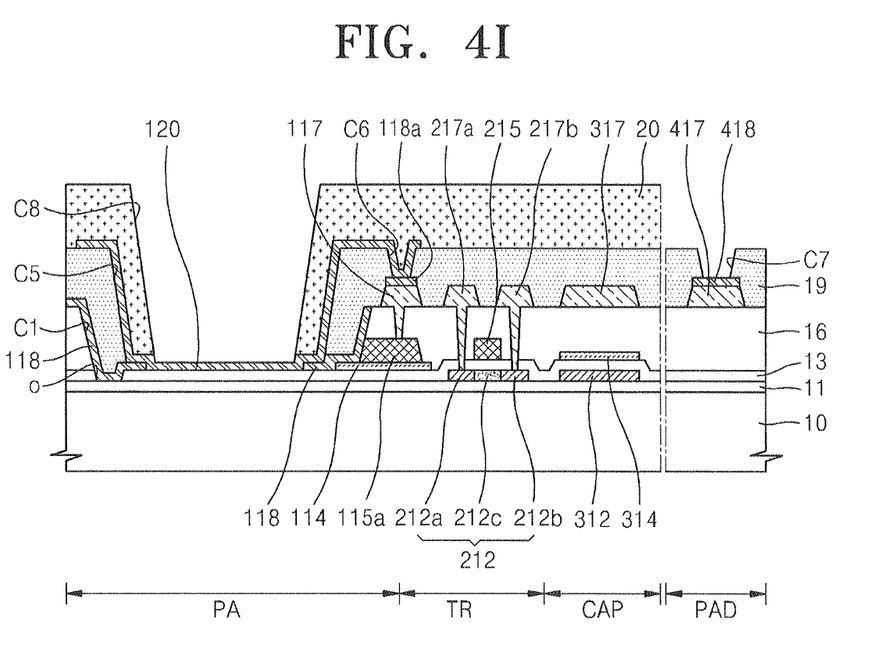

FIG. 4I is a cross-sectional view schematically illustrating a ninth mask process in the organic light emitting display device, according to the present embodiment.

In reference to FIG. 4I, a fourth insulating layer 20 is formed, and then an opening C8 is formed in the fourth insulating layer 20 so as to expose an upper portion of the pixel electrode 120. The fourth insulating layer 20 serves as a pixel define layer (PDL), and may be formed of an organic insulation material including general-purpose polymers such as PMMA or PS, polymer derivatives including a phenol group, acrylic polymers, imide-based polymers, aryl ether polymers, amide-based polymers, fluorine-based polymers, p-xylene polymers, vinyl alcohol-based polymers, or blends thereof.

The opening C8 of the fourth insulating layer 20 may be formed so that the bonding assistant layer 118 may not be an obstacle to forming a micro cavity structure with the pixel electrode 120 and the opposite electrode 122. For example, the opening C8 may be formed so that the inner end of the bonding assistant layer 118 does not project and extend far beyond an etched surface of the opening C8. In other words, a size of the opening C8 may be determined so that the fourth insulating layer 20 covers a portion of the bonding assistant layer 118 exposed by the opening C5 of the third insulating layer 19, i.e., the inner end of the bonding assistant layer 118. If the exposed inner end of the bonding assistant layer 118 extends beyond the opening C8, the micro-cavity structure may collapse.

An intermediate layer including the emissive layer (121 of FIG. 2) is formed on the resultant structure of FIG. 4I, and then the opposite electrode (122 in FIG. 2) is formed.

In the organic light emitting display device and the method of manufacturing the same according to the above embodiments of the present invention, the pixel electrode 120 is configured to include a transflective metal layer, thereby improving the optical efficiency of the organic light emitting display device due to the formation of a micro-cavity.

Furthermore, since the source electrode 217*a* or the drain electrode 217*b* are covered by an organic layer, i.e., the third insulating layer 19, the source or drain electrode 217*a* or 217*b* is not exposed to an etchant including Ag ions, thereby preventing occurrence of particle defects due to eduction of Ag.

By forming the second pad layer 418 on the first pad layer 417 and the bonding assistant layer 118 together using a single processing step, the number of processes may not be increased. Furthermore, the presence of the second pad layer 418 and the second contact layer 118*a* on the first pad layer 417 and the first contact layer 117, respectively, may prevent exposure of the first contact layer 117 and the first pad layer 417 to an etchant, thereby suppressing particle defects due to eduction of Ag.

The pixel electrode contact unit PECNT also has a plurality of contact structures so as to prevent problems caused by contact defects.

The organic light emitting display device according to the present embodiment includes the bonding assistant layer 118 to improve adhesion properties of the third insulating layer 19 that is an organic insulating layer. Thus, it is possible to prevent discontinuous deposition of the pixel electrode 120 and shorting between the pixel electrode 120 and the opposite electrode 122 due to weak adhesion of the third insulating layer. These advantages will now be described in more detail by comparing the organic light emitting display device according to the present embodiment with an organic light emitting display device according to a comparative example of the present invention.

Figure 5:
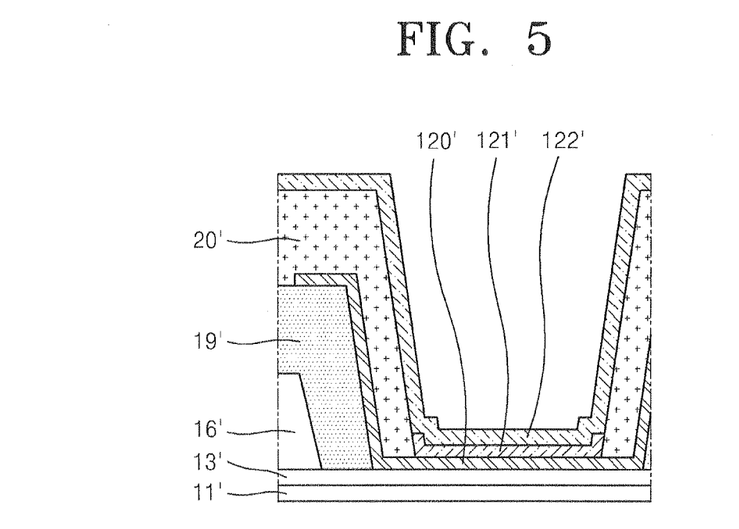
FIG. 5 is a cross-sectional view of a portion of a pixel area of an organic light emitting display device according to a comparative example of the present invention.
Figure 6:
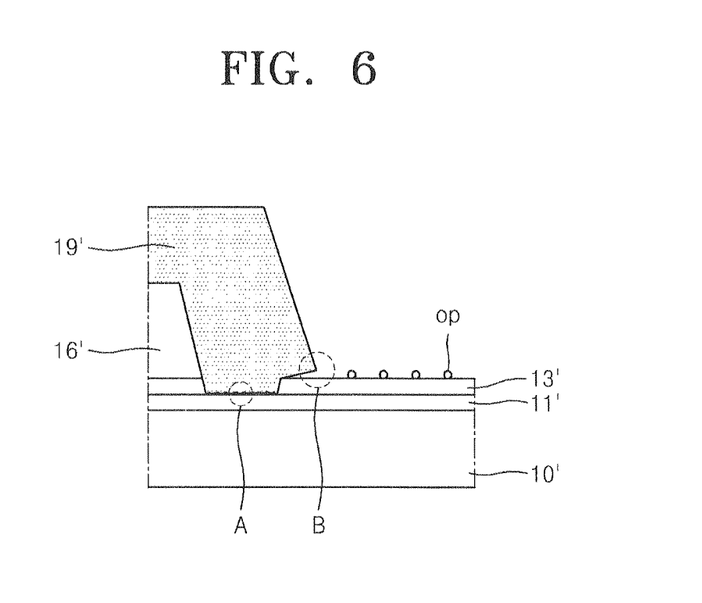
FIG. 6 is a cross-sectional view illustrating a state in which a third insulating layer shown in FIG. 5 has been formed.
Figure 7:
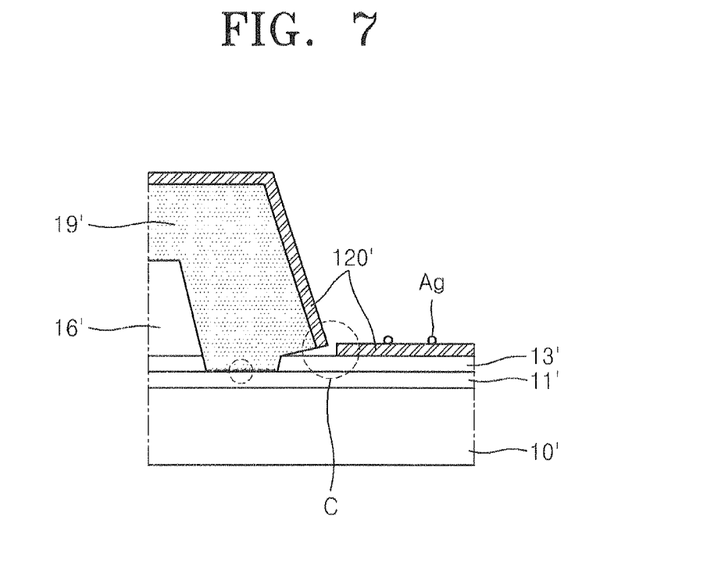
FIG. 7 is a cross-sectional view illustrating a state in which a pixel electrode has been formed on a third insulating layer shown in FIG. 6.

FIG. 5 is a cross-sectional view of a portion of a pixel area of an organic light emitting display device without a bonding assistant layer, according to a comparative example of the present invention. FIG. 6 is a cross-sectional view illustrating a state in which a third insulating layer 19' shown in FIG. 5 has been formed. FIG. 7 is a cross-sectional view illustrating a state in which a pixel electrode 102' has been formed on the third insulating layer 19' shown in FIG. 6.

In reference to FIGS. 5 through 7, the organic light emitting display device does not include a bonding assistant layer. Thus, the third insulating layer 19' that is an organic layer directly contacts inorganic layers, i.e., a buffer layer 11' and/or a first insulating layer 13'. Since an organic layer exhibits weak adhesion to an inorganic layer, an adhesion failure may occur between the third insulating layer 19' and the buffer layer 11' and/or the first insulating layer 13'.

For example, as shown in FIG. 6, the third insulating layer 19' may detach from the buffer layer 11' (See portion A) and from the first insulating layer 13' (See portion B). Due to the weak adhesion of the third insulating layer 19' to the buffer layer 11' and the first insulating layer 13', organic particles op may fall from an edge of the third insulating layer 19' during a process subsequent to formation of the third insulating layer 19'.

Furthermore, in reference to FIG. 7, the pixel electrode 120' may be discontinuously deposited due to the weak adhesion or detachment of the third insulating layer 19'. Since a discontinuous portion of the pixel electrode 120' is exposed in a sequential manufacturing process, particles such as Ag may fall from the discontinuous portion.

The organic particles op and the Ag particles described with reference to FIGS. 6 and 7 may cause a dark spot or short between the pixel electrode 120' and an opposite electrode.

Figure 8:
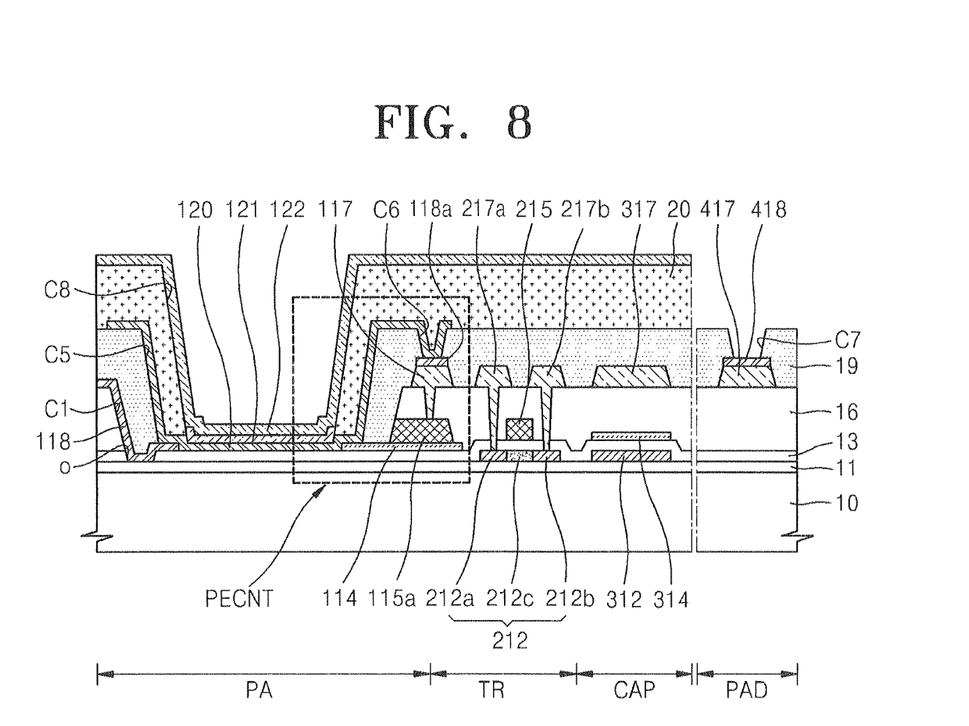
FIG. 8 is a schematic cross-sectional view of an organic light emitting display device according to another embodiment of the present invention.

FIG. 8 is a schematic cross-sectional view of an organic light emitting display device according to another embodiment of the present invention. Hereinafter, like reference numerals refer to the like elements. Only differences from the organic light emitting display device described with reference to FIGS. 2 and 3 will now be described with reference to FIG. 8.

The organic light emitting display device according to the present embodiment is configured so that a bonding assistant layer 118 partially encloses a pixel. That is, while the bonding assistant layer 118 shown in FIG. 3 has a doughnut-shaped closed loop structure to enclose the entire pixel, the bonding assistant layer 118 according to the present embodiment has an open loop structure to enclose a portion of the pixel. For example, the bonding assistant layer 118 may have an open loop structure that encloses an area excluding a pixel electrode contact unit PECNT.

Like in the embodiment described with reference to FIG. 2, the pixel electrode contact unit PECNT includes a first contact layer 117 including a same material as that of source and drain electrodes 217a and 217b, a second contact layer 118a including a same material as that of the bonding assistant layer 118, a third contact layer 114 including a TCO, and a fourth contact layer 115a including a same material as a gate electrode 215. The organic light emitting display device according to the present embodiment is different from the embodiment described with reference to FIG. 2 in that the pixel electrode 120 may be connected directly to the second contact layer 118a as well as to the third contact layer 114.

Similar to the embodiment described with reference to FIG. 2, the pixel electrode 120 is configured to include a transflective metal layer, thereby improving the optical efficiency of the organic light emitting display device due to the formation of a micro-cavity.

Furthermore, as described above with reference to FIG. 2, since the source electrode 217a or the drain electrode 217b are covered by an organic layer, i.e., the third insulating layer 19, the source or drain electrode 217a or 217b is not exposed to an etchant including Ag ions, thereby preventing occurrence of particle defects due to eduction of Ag.

Like in the embodiment described with reference to FIG. 2, by forming a second pad layer 418 on a first pad layer 417 and the bonding assistant layer 118 together using a single process, the number of processes may not be increased. Furthermore, the presence of the second pad layer 418 and the second contact layer 118a on the first pad layer 417 and the first contact layer 117, respectively, may prevent exposure of the first contact layer 117 and the first pad layer 417 to an etchant, thereby suppressing particle defects due to eduction of Ag.

According to embodiments of the present invention, an organic light emitting display device includes a bonding assistant layer to improve adhesion properties of a third insulating layer that is an organic insulating layer. Thus, it is possible to prevent the occurrence of a short circuit between a pixel electrode and an opposite electrode due to detachment of the third insulating layer and/or due to foreign materials.

The pixel electrode is also configured to include a transflective metal layer, thereby enhancing the optical efficiency of the organic light emitting display device due to formation of a micro-cavity.

Furthermore, since the source electrode or the drain electrode (including a data wiring) are covered by the third insulating layer, it is possible to prevent eduction of silver (Ag) caused by the source electrode and the drain electrode during patterning of the pixel electrode.

In addition, formation of respective protective layers on a first contact layer of a pixel electrode contact unit and a first pad layer of a pad electrode may prohibit eduction of Ag due to the first contact layer and the first pad layer during patterning of the pixel electrode.

The pixel electrode contact unit also has a plurality of contact structures so as to prevent shorting of signals between the pixel electrode and a driving device.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, all the changes or modifications within the scope of the appended claims and their equivalents will be construed as being included in the present invention.

What is claimed is:

1. An organic light emitting display device comprising:
a substrate including a thin film transistor (TFT) formed thereon, wherein the TFT includes an active layer, a gate electrode, a source electrode and a drain electrode, a first insulating layer disposed between the active layer and the gate electrode, and a second insulating layer disposed between the gate electrode, and the source and drain electrodes;
a pad electrode including a first pad layer, which is disposed on a same layer as that where the source electrode and the drain electrode are formed, and a second pad layer disposed on the first pad layer;
a bonding assistant layer formed on the substrate;
a third insulating layer formed on the bonding assistant layer and including a first opening;
a pixel electrode formed in the first opening of the third insulating layer and electrically coupled to one of the source electrode and the drain electrode;
a fourth insulating layer that is formed on the pixel electrode so as to cover a peripheral end portion of the pixel electrode and define a pixel through a second opening at a location corresponding to the first opening of the third insulating layer;
an emissive layer disposed on the pixel electrode; and
an opposite electrode disposed on the emissive layer.

2. The organic light emitting display device of claim 1, wherein an inner end of the bonding assistant layer extends to an etched surface of the first opening of the third insulating layer.

3. The organic light emitting display device of claim 1, wherein an inner end of the bonding assistant layer extends beyond an etched surface of the first opening of the third insulating layer and is exposed through the first opening.

4. The organic light emitting display device of claim 3, wherein the fourth insulating layer covers the inner end of the bonding assistant layer exposed by the first opening.

5. The organic light emitting display device of claim 3, wherein the pixel electrode directly contacts the inner end of the bonding assistant layer.

6. The organic light emitting display device of claim 1, wherein the bonding assistant layer encloses at least a portion of the pixel.

7. The organic light emitting display device of claim 1, wherein the third insulating layer is an organic insulating layer.

8. The organic light emitting display device of claim 1, wherein the fourth insulating layer is an organic insulating layer.

9. The organic light emitting display device of claim 1, wherein the third insulating layer covers the source electrode and the drain electrode.

10. The organic light emitting display device of claim 1, wherein the bonding assistant layer comprises a same material as that of the second pad layer.

11. The organic light emitting display device of claim 1, wherein the bonding assistant layer comprises a transparent conducting oxide.

12. The organic light emitting display device of claim 11, wherein the bonding assistant layer comprises indium tin oxide (ITO).

13. The organic light emitting display device of claim 1, wherein the first pad layer comprises a same material as that of the source electrode and the drain electrode.

14. The organic light emitting display device of claim 1, wherein the pixel electrode comprises a transflective metal layer.

15. The organic light emitting display device of claim 14, wherein the transflective metal layer is made of silver (Ag) or Ag alloy.

16. The organic light emitting display device of claim 14, wherein a protective layer of a transparent conducting oxide is stacked on the transflective metal layer.

17. The organic light emitting display device of claim 1, wherein a portion of the first insulating layer includes a hole in a region corresponding to an edge of the pixel.

18. The organic light emitting display device of claim 1, further comprising a buffer layer that is formed between the substrate and the first insulating layer and is formed of an inorganic material.

19. The organic light emitting display device of claim 1, wherein an opening formed in the second insulating layer, the first opening of the third insulating layer, and the second opening of the fourth insulating layer overlap one another, and wherein a size of the first opening is larger than that of the second opening and smaller than that of the opening of the second insulating layer.

20. The organic light emitting display device of claim 1, further comprising a pixel electrode contact unit that electrically connects one of the source electrode and the drain electrode to the pixel electrode through a contact hole formed in the third insulating layer, and wherein the pixel electrode contact unit has a plurality of contact points.

21. The organic light emitting display device of claim 20, wherein the pixel electrode contact unit comprises a first contact layer including a same material as that of the source electrode and the drain electrode, and a second contact layer including a same material as that of the second pad layer.

22. The organic light emitting display device of claim 21, wherein the pixel electrode electrically contacts the second contact layer.

23. The organic light emitting display device of claim 21, wherein the pixel electrode contact unit further comprises a third contact layer, which is disposed between the first and second insulating layers and includes a same material as that of a second electrode of a capacitor, and a fourth contact layer formed on the third contact layer.

24. The organic light emitting display device of claim 23, wherein the pixel electrode electrically contacts the third contact layer.

* * * * *